United States Patent [19]

Lee

[11] Patent Number: 5,414,468
[45] Date of Patent: May 9, 1995

[54] APPARATUS FOR DECODING VARIABLE LENGTH CODES

[75] Inventor: Heung Soon Lee, Seoul, Rep. of Korea

[73] Assignee: Goldstar Co., Ltd., Seoul, Rep. of Korea

[21] Appl. No.: 61,667

[22] Filed: May 14, 1993

[30] Foreign Application Priority Data

May 19, 1992 [KR] Rep. of Korea .............. 8454/1992

[51] Int. Cl.$^6$ .................. H04N 7/133; H04N 7/137
[52] U.S. Cl. ............................ 348/402; 348/423
[58] Field of Search ............. 358/105, 133, 136; H04N 7/133, 7/137; 348/402, 409, 413, 416, 423, 699

[56] References Cited

U.S. PATENT DOCUMENTS

| | | | |
|---|---|---|---|
| 4,727,421 | 2/1988 | Koga | 358/133 |
| 4,957,688 | 9/1990 | De With | 358/133 |
| 5,117,288 | 5/1992 | Eisenhardt et al. | 358/136 |
| 5,146,325 | 9/1992 | Ng | 358/156 |
| 5,148,271 | 9/1992 | Kato et al. | 358/133 |
| 5,148,272 | 9/1992 | Acampora et al. | 358/133 |
| 5,241,382 | 8/1993 | Paik et al. | 358/133 |
| 5,247,363 | 9/1993 | Sun et al. | 358/105 |
| 5,253,053 | 10/1993 | Chu et al. | 358/133 |
| 5,262,854 | 11/1993 | Ng | 358/133 |

OTHER PUBLICATIONS

"L64750/51 CCITT Variable Length Coder/Decoder", LSI Logic, Feb. 1991, pp. 1-9.
"Hardware Implementation of a Codec for a Digital HDTV Recording", P. Stammnitz, K. Bottcher, K. Gruneberg, U. Hofker, H. Klein, Heinrich-Hertz-Institut fur Nachrichtentechnik, Berlin GmbH, 1991, pp. 515-522.

Primary Examiner—Tommy P. Chin
Assistant Examiner—Richard Lee
Attorney, Agent, or Firm—Fliesler, Dubb, Meyer & Lovejoy

[57] ABSTRACT

A variable length decoding apparatus capable of a decoding processing at a low speed. The apparatus comprises an initializer for detecting a picture start code, a decoding circuit for receiving data 32 bits by 32 bits and decoding variable length codes, according to a control signal from the initializer, a control circuit for controlling the decoding operation of the decoding circuit, an information type buffering circuit for outputting type signals indicating whether frames, slices and macroblocks are full information or difference information, and outputting horizontal/vertical motion vector information, an extra run level generating circuit for generating data corresponding to a shortage of data, based on a run length code decoding signal outputted from the decoding circuit, a multiplexing circuit for composing an extra run level signal from the extra run level generating circuit, decoded luminance information and decoded color information together, a data buffering circuit for buffering luminarice signals and color signals, and a coefficient generating circuit for detecting discrete cosine transform (DCT) coefficients from the luminance signals and color signals and outputting the detected DCT coefficients.

3 Claims, 2 Drawing Sheets

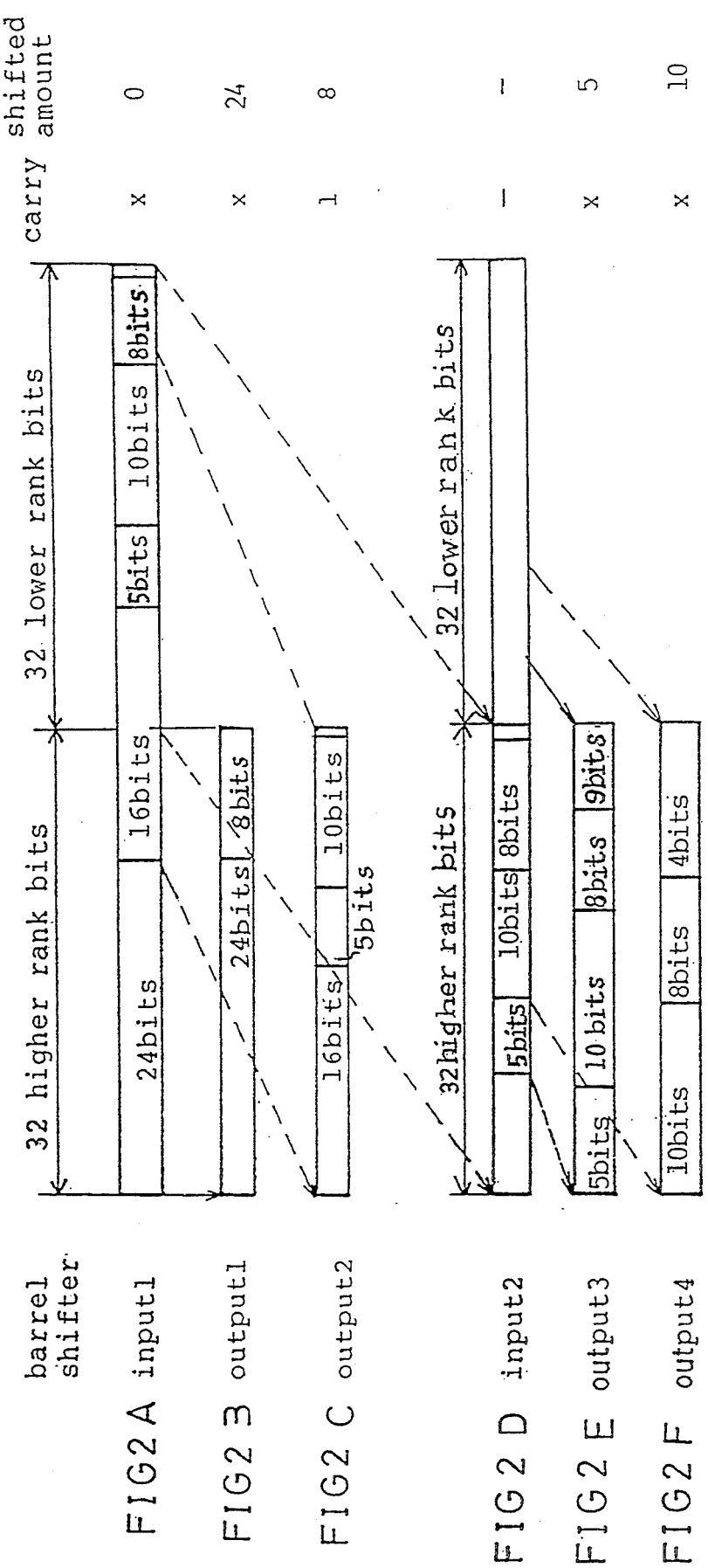

APPARATUS FOR DECODING VARIABLE LENGTH CODES

BACKGROUND OF THE INVENTION

1. Field of the Invention

The present invention relates to an apparatus for decoding variable length codes, and more particularly to a variable length decoding apparatus capable of achieving a data processing at a low speed and thus usable in high definition televisions (HDTVs).

2. Description of the Prior Art

Generally, there have been known various methods for compressively encoding digital video signals and decoding them. In cases of HDTVs, video motion information is subjected to a discrete cosine transform (DCT), so as to derive its DCT coefficient. The DCT coefficient is quantized and then coded by macroblocks in a variable length coding manner. The obtained variable length code is then sent to a channel. In a receiver device, the variable length code indicative of video information received from the channel is decoded to recover the DCT coefficient. Based on the information expressed by the recovered DCT coefficient, the video is recovered.

Generally, a row of input data is constituted by Y and C coefficients and codes indicative of the characteristics of macroblocks thereof, which have been compressed in a time-division manner. Accordingly, the variable length decoder device which must decode such data should operate at a speed higher than a pixel clock. General HDTVs have a pixel clock of at least 60 MHz. However, there have been known no device enabling a process at a speed higher than such a pixel clock. Therefore, needed is a low speed-processing decoder device capable of processing data at a speed meeting the pixel clock.

Conventionally, such a data processing at a low speed has been achieved, by using a plurality (for example, four or five) of variable length decoders connected in parallel, using an encoding algorithm adapted to adjust the yield of data by the unit of a slice. However, such an arrangement that a plurality of variable length decoders are connected in parallel results in a complex system and an increase in cost. Moreover, an area occupied by the decoder device is increased, thereby resulting in a limitation on compactness.

SUMMARY OF THE INVENTION

Therefore, an object of the invention is to provide a variable length decoding apparatus capable of decoding variable length codes by using a single variable length decoder.

In accordance with the present invention, this object can be accomplished by providing an apparatus for decoding variable length codes comprising: an initializer for detecting a picture start code of compressed video data received from a channel and outputting a control signal for informing of the start of a decoding operation; decoding means for decoding variable length codes by code types, according to the control signal from the initializer, while shifting compressed video data received from the initializer by the length of decoded codes; a control circuit for controlling decoding operations of the decoding means carried out by information kinds and controlling an overall operation of the apparatus; a picture type buffering circuit for buffering shifted data, to output type signals indicating whether frames, slices and macroblocks are full information or difference information, and receiving motion vector information decoded in the decoding means, to output it as horizontal/vertical motion vector information; an extra run level generating circuit for generating data corresponding to a shortage of data, based on a run length code decoding signal outputted from the decoding means; a multiplexing circuit for composing an extra run level signal from the extra run level generating circuit, decoded luminarice information from the decoding means and decoded color information from the decoding means together; a data buffering circuit for buffering luminance signals and color signals outputted from the multiplexing circuit; and a coefficient generating circuit for detecting discrete cosine transform (DCT) coefficients from the luminance signals and color signals and outputting the detected DCT coefficients.

BRIEF DESCRIPTION OF THE DRAWINGS

Other objects and aspects of the invention will become apparent from the following description of embodiments with reference to the accompanying drawings in which:

FIGS. 2A to 2F are diagrams, explaining inputs and shifted bits of outputs of a barrel shifter included in the variable length decoding apparatus according to the present invention.

DETAILED DESCRIPTION OF THE PREFERRED EMBODIMENTS

Figure 1:
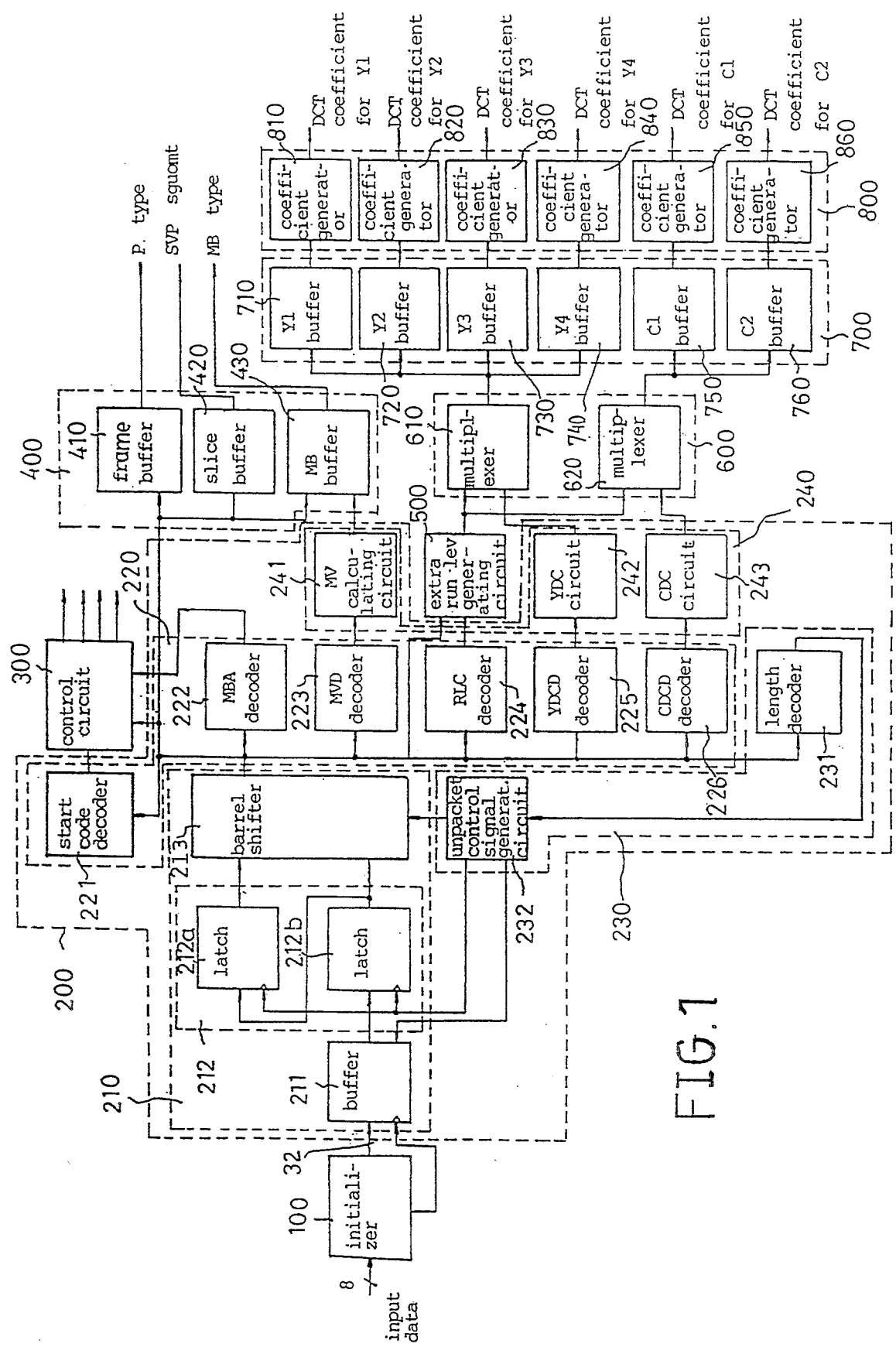
FIG. 1 is a block diagram of a variable length decoding apparatus according to the present invention.

Referring to FIG. 1, there is illustrated a variable length decoding apparatus according to the present invention.

As shown in FIG. 1, the variable length decoding apparatus comprises an initializer 100 for detecting a picture start code (PSC) of compressed video data received from a channel and outputting a control signal for informing of the start of decoding, a decoding circuit 200 for decoding variable length codes by code types, according to the control signal from the initializer, while shifting compressed video data received from the initializer 100 by the length of decoded codes, and a control circuit 300 for controlling the decoding operations of the decoding circuit 200 carried out by code types and controlling the overall operation of the variable length decoding apparatus. A picture type buffering circuit is also provided, which is connected to barrel shifted data, for outputting type signals indicating whether frames, slices and macroblocks are full information or difference information, and receive motion vector information decoded in the decoding circuit 200, to output it horizontal/vertical motion vector information. The variable length decoding apparatus also comprises an extra run level generator 500 for generating data corresponding to a shortage of data, based on a run length code (RLC) decoding signal outputted from the decoding circuit 200, a multiplexing circuit 600 for composing an extra run level signal from the extra run level generating circuit 500, decoded luminance information from the decoding circuit 200 and decoded color information from the decoding circuit 200 together, buffering circuit 700 for buffering luminance signal Y1 to Y4 and color signals C1 and C2 outputted from the multiplexing circuit 600, and a coefficient generating circuit 800 for detecting DCT coefficients from the luminance signals Y1 to Y4 and color signals C1 and C2 and outputting the detected DOT coefficients.

The decoding circuit 200 includes an unpacker 210 for aligning rearranged data received from the initializer 100 by predetermined bits, based on the control signal from the initializer 100, and then shifting the data by the length of decoded codes, based on an unpacket control signal from an unpacker control circuit 230 which also constitutes a part of the decoding circuit 200. The decoding circuit 200 also includes an information decoding circuit 220 for decoding the shifted data from the unpacker 210 by code types, based on an code type control signal generated from the control circuit 300. An unpacker control circuit 230 is also provided for adding the length of codes, based on both the code type control signal from the control circuit 300 and data outputted from the unpacker 210, and outputting an unpacker control signal according to the length of decoded code, at the unpacker 210. The decoding circuit 200 also includes a calculating circuit 240 for converting motion vectors and differential pulse-code modulation (DPCM) codes of luminarice and color information into original data.

The unpacker 210 of the decoding circuit 200 comprises a buffer 211 adapted to store data 32 bits by 32 bits, based on the control signal from the initializer 100, to correct delay times occurring at the packer and the encoder side, two latches 212a and 212b adapted to bind two 32-bit data and output them, under a control of the unpacker control circuit 230, and a barrel shifter 213 adapted to receive 64-bit data from the latches 212a and 212b and output 32-bit data while shifting it by the length of decoded codes, under the control of the unpacker control circuit 230.

The information decoding circuit 220 of the decoding circuit 200 receives data which is outputted from the unpacker 210 after being shifted and is enabled to decode codes, based on a decoding control signal generated by the control circuit 300 correspondingly to the code type. The information decoding circuit 220 includes various decoders, that is, a start code decoder 221 adapted to decode a start code and send it as a decoding signal to the control circuit 300, a macroblock address (MBA) decoder 222 adapted to decode a MBA and send it as a decoding signal to the control circuit 300, a macroblock vector difference (MVD) decoder 223 adapted to decode a MVD, a run length code (RLC) decoder 224 adapted to decode a RLC, a luminance DC difference (YDCD) decoder 225 adapted to decode a YDCD signal, and a color DC difference (CDCD) decoder 226 adapted to decode a CDCD signal.

The unpacker control circuit 230 includes a length decoder 231 adapted to detect the length of currently decoded codes, based on both the picture type control signal from the control circuit 300 and output data from the barrel shifter 213, and an unpacker control signal generating circuit 232 adapted to generate an output control signal for the buffer 211, a latch control signal for the latches 212a and 212b and a shift control signal for controlling the data shifting amount of the barrel shifter 213, based on an output signal from the length decoder 231.

The picture type buffering circuit 400 includes a frame buffer 410, a slice buffer 420 and a macroblock buffer 430. The macroblock buffer 430 outputs a signal indicative of the type of each macroblock and motion vector information.

The multiplexing circuit 600 includes a multiplexer 610 adapted to compose luminance DC calculation information from the decoding circuit 200 and an extra run level from the extra run level generating circuit 500, and a multiplexer 620 adapted to color DC calculation information from the decoding circuit 200 and an extra run level from the extra run level generating circuit 500.

The data buffering circuit 700 includes a Y1 buffer 710, a Y2 buffer 720, a Y3 buffer 730 and a Y4 buffer 740, which are adapted to buffer luminance signals Y1 to Y4, respectively, The data buffering circuit 700 also includes a C1 buffer 750 and a C2 buffer 760 both for buffering color signals. The coefficient generating circuit 800 includes four coefficient generators 810, 820, 830 and 840 corresponding to the buffers of the data buffering circuit 700 and adapted to generate DCT coefficients of luminarice signals Y1 to Y4, respectively. The coefficient generating circuit 800 also includes two coefficient generators 850 and 860 for DCT coefficients of color signals C1 and C2, respectively.

Operation of the variable length decoding apparatus with the above-mentioned arrangement will now be described.

Since a row of input data encoded in and transferred from an encoder is constituted by Y and C coefficients and codes indicative of the characteristics of macroblocks thereof, which have been compressed in a time-division manner, the variable length decoding apparatus which must decode such data should operate at a speed higher than a pixel clock. General HDTVs have a pixel clock of at least 60 MHz. However, there have been known no device enabling a process at a speed higher than such a pixel clock.

Accordingly, the present invention enables a variable length decoding process at a low speed, by decoding at least one slice of data for generating DCT coefficients by using an encoding algorithm capable of adjusting the amount of generated data by the unit of slice, buffering the decoded data by adding it with an extra run level, and then starting a generation of coefficients.

As 8 bit data is inputted upon starting a decoding operation, the initializer 100 detects a PSC initially inputted and generates a PSC detection signal. Based on the PSC detection signal, the initializer 100 packs the input data by the unit of 32 bits with reference to the PSC and then sends the bound data to the buffer 211 of the decoding circuit 200. The buffer 211 outputs data 32 bits by 32 bits so that data of 64 bits are latched in two latches 212a and 212b. Thereafter, the 64 bit data is loaded in the barrel shifter 213 which, in turn, sends previously loaded data of 32 bits to the barrel shifter 213. Then, the start decoder 221 of the decoding circuit 220 detects the PSC and a slice start code (SSC) which are, in turn, sent to the control circuit 300, Based on the PSC and SSC, the control circuit 300 outputs control signals for sequentially enabling various decoders of the decoding circuit 220 such as MBA decoder 222, the MVD decoder 223, . . . , according to a transfer protocol predetermined by kinds of data. Simultaneously, the control circuit 300 outputs an code types signal according to the protocol, at the length decoder 231. The length decoder 231 detects the length of codes, based on data outputted from the barrel shifter 213 and the code types. Based on the decoded code length, the control signal generating circuit 232 generates a shift control signal, so as to control the amount of shifted data of the barrel shifter 213.

For example, where the variable length decoding apparatus receives sequentially a PSC of 24 bits, a SSC of 16 bits, SOUANT of 5 bits, first information of 10 bits, second information of 8 bits, third information of 7 bits, fourth information of 3 bits, . . . , the barrel shifter 213 loads 24 bits, 16 bits, 5 bits, 10 bits, 8 bits and 1 bit (namely, one bit of the second information) received from the two latches 212a and 212b therein, as shown in FIG. 2A. Since the amount of shifted data is initially zero, the barrel shifter 213 outputs higher rank 32 bits of the received 64 bits, as shown in FIG. 2B.

At this time, the control circuit 300 sends an enable signal to the start code decoder 221 and a control signal informing of the start code to the length decoder 231. As a result, the start code decoder 221 decodes the PSC of 24 bits. Also, the length decoder 231 detects the length of 24 bits and outputs a 24-bit length detection signal. Based on the 24-bit length detection signal, the unpacker control signal generating circuit 232 adds the amount of just previously shifted bits, namely, zero to the length of currently decoded information, namely, 24 and then compared the resultant sum with the number of output bits of the barrel shifter 213, namely, 32. After the comparison, the unpacker control signal generating circuit 232 outputs a 24-bit shift control signal, because the sum is less than 32. Based on the shift control signal, the barrel shifter 213 outputs codes corresponding to 32 lower rank bits starting from 25th bit which follows the shifted 24 higher rank bits.

Then, the length decoder 231 detects the length of 16 bits in the same manner as mentioned above. Also, the unpacker control signal generating circuit 232 adds 16 to 24 that is the amount of just previously shifted bits. Since the resultant sum exceeds 32 by 8, the buffer 211 outputs new information of 32 bits. Accordingly, the lower rank bit latch 212b is controlled to store the new 32 bits and the higher rank bit latch 212a is controlled to store the previous 32 lower rank bits which was stored in the lower rank bit latch 212b. Also, the unpacker control signal generating circuit 232 outputs a control signal to shift the remaining 8 bits at the barrel shifter 213.

That is, the unpacker control signal generating circuit 232 is a 5-bit adder and generates a carry signal when the sum of the amount of just previously shifted bits and the length of currently decoded information exceeds 32. In this case, the buffer 211 and the latch 212 are controlled by the carry signal. The remaining bits exceeding 32 are sent to the barrel shifter 213, as a new amount of shifted bits.

Accordingly, new data of 64 bits is inputted at the barrel shifter 213, as shown in FIG. 2D. The barrel shifter 213 also receives the control signal to shift the excessive 8 bits, so that it outputs codes corresponding to 32 bits including 8 shifted bits, as shown in FIG. 2E.

Thereafter, the above procedures are repeated, so as to decode information of 5 bits, 10 bits, . . . according to respective lengths thereof while sequentially shifting them, as shown in FIGS. 2E and 2F.

In this case, the control circuit 300 enables a decoder corresponding the kind of information following the currently decoded information, according to the protocol. Also, the control circuit 300 sends a control signal corresponding to the kind of information, to the length decoder 231. Based on the control signal, the length decoder 231 selects one of address trees predetermined according to kinds of information. Following the address tree from the highest rank bit of the code outputted from the barrel shifter 213, the end of the address tree can detected, thereby enabling the length of information to be detected.

On the other hand, the MV calculating circuit 241 receives motion information of videos transferred in a DPCM manner and converts them into original motion information. In similar, the YDCD calculating circuit 242 and the CDCD calculating circuit 243 receive DC values of coefficients in the DCT blocks transferred in the DPCM manner and convert them into original data.

Even for all data which include no motion information transferred by the encoder since they involve no motion, it is required to make information of blocks including no motion. This is because where only the transferred motion values are stored, it is impossible to know macroblocks including the motion values.

Also, the extra run level generating circuit 500 detects EOB codes and fill zero in portions of 3×8 blocks to which no information value was not transferred so that every block includes 64 coefficient information, thereby enabling the coefficient generating circuit 800 to generate DCT coefficients. As a result, the buffering circuit 700 stores DC information of the luminarice signals Y1 to Y4 and color signals C1 and C2 together with motion information including values of zero. For the information stored in the buffers 710 to 760, DCT coefficients meeting respective macroblocks are generated in the coefficient generator 810 to 860, respectively. The information meeting each macroblock is also sent to next stage.

As apparent from the above description, the present invention makes it possible to embody a variable length decoding apparatus for a HDTV, capable of achieving a data processing at a low speed, by providing buffers proper in number at a downstream stage according to a buffer control algorithm for an encoding apparatus. Accordingly, it is also possible to embody a variable length decoding apparatus for a HDTV using existing ICs. The present invention provides an effect that a decoding process can be achieved only by a single stage decoder, without using a conventional arrangement including multi-stage decoders connected in parallel with one another.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for decoding variable length codes formed of different code types having different code lengths comprising:
   an initializer for detecting a picture start code of compressed video data received from a channel and outputting a control signal for informing of the start of a decoding operation;
   decoding means for aligning the video data from the initializer and decoding said variable length codes by said code types, according to the control signal from the initializer; and providing decoded motion vector information, decoded luminance information, decoded color information, and decoded run length information;

a control circuit for controlling the operation of the apparatus in response to the code types decoded by the decoding means;

a picture buffering circuit for buffering the video data from the decoding means, to output buffer signals indicating whether full information or difference information is present, and for receiving and outputting motion vector information decoded in the decoding means as horizontal/vertical motion vector information;

an extra run level generating circuit for generating extra data corresponding to a shortage of data, based on the run length information outputted from the decoding means;

a multiplexing circuit for composing an extra run level signal from the extra data from the extra run level generating circuit, said decoded luminance information from the decoding means and said decoded color information from the decoding means;

a data buffering circuit for buffering luminance signals and color signals outputted from the multiplexing circuit; and a coefficient generating circuit for detecting discrete cosine transform coefficients from the luminance signals and color signals from the data buffering circuit and outputting the detected coefficients.

2. An apparatus in accordance with claim 1, wherein the decoding comprises:

unpacker means, including means for aligning data received from the initializer by predetermined bits, based on the control signal from the initializer, and including means for shifting the data by the decoded run length information of the decoded code types, based on an unpacker control signal;

an information decoding circuit for providing the unpacker control signal by decoding the shifted data from the unpacker means based on both a control signal generated from the control circuit as a function of the decoded code types and data outputted from the unpacker means; and a calculating circuit for converting said motion vector information, said luminance information and said color information into original data.

3. As apparatus in accordance with claim 2, wherein the unpacker means comprises:

a buffer for buffering data 32 bits by 32 bits, based on the control signal from the initializer, to correct delay times;

a pair of latches for binding two 32-bit data inputs and output them as 64-bit data outputs; and a barrel shifter for receiving said 64-bit data outputs from the latches and output 32-bit data while shifting it by the decoded run length information.

* * * * *